United States Patent
Zan et al.

(10) Patent No.: US 10,263,089 B2
(45) Date of Patent: Apr. 16, 2019

(54) TRANSISTOR INCLUDING ACTIVE LAYER HAVING THROUGH HOLES AND MANUFACTURING METHOD THEREOF

(71) Applicant: E Ink Holdings Inc., Hsinchu (TW)

(72) Inventors: Hsiao-Wen Zan, Hsinchu (TW); Chuang-Chuang Tsai, Hsinchu (TW); Chia-Wei Chou, Hsinchu (TW); Cheng-Hang Hsu, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 28 days.

(21) Appl. No.: 14/706,987

(22) Filed: May 8, 2015

(65) Prior Publication Data
US 2016/0064499 A1    Mar. 3, 2016

(30) Foreign Application Priority Data

Aug. 26, 2014   (TW) .............................. 103129352 A

(51) Int. Cl.
*H01L 29/423*   (2006.01)
*H01L 29/06*    (2006.01)
(Continued)

(52) U.S. Cl.
CPC ...... *H01L 29/4238* (2013.01); *H01L 21/0272* (2013.01); *H01L 21/28026* (2013.01);
(Continued)

(58) Field of Classification Search
CPC ............ H01L 51/0545; H01L 29/7827; H01L 51/102; H01L 29/4238; H01L 21/0272;
(Continued)

(56) References Cited

U.S. PATENT DOCUMENTS 7,700,403 B2   4/2010 Arai et al.
2004/0253771 A1*  12/2004 Yamazaki ........... H01L 27/1237
                                           438/149
(Continued)

FOREIGN PATENT DOCUMENTS

CN    1707340    12/2005
CN    102629051   8/2012

OTHER PUBLICATIONS

Koo, J. B., Lim, J. W., Kim, S. H., Ku, C. H., Lim, S. C., Lee, J. H., . . . & Yang, Y. S. (2006). Pentacene thin-film transistors and inverters with dual-gate structure. Electrochemical and solid-state letters, 9(11), G320-G322.*

*Primary Examiner* — Thao X Le
*Assistant Examiner* — Laura M Dykes
(74) *Attorney, Agent, or Firm* — JCIPRNET

(57) ABSTRACT

A transistor including a substrate, a gate layer, a first insulating layer, an active layer, a source and a drain is provided. The gate layer is disposed on the first insulating layer, and has a plurality of first through holes. The first insulating layer covers the gate layer and a part of the substrate exposed by the first through holes, and forms a plurality of recesses respectively corresponding to the first through holes. The active layer is disposed on the first insulating layer, and has a plurality of second through holes. The second through holes communicate with the recesses, respectively. The source is disposed on a part of the active layer. The drain is disposed on another part of the active layer. A manufacturing method of the transistor is also provided.

7 Claims, 5 Drawing Sheets

(51) Int. Cl.
  *H01L 21/28* (2006.01)
  *H01L 29/10* (2006.01)
  *H01L 21/027* (2006.01)
  *H01L 21/311* (2006.01)
  *H01L 29/66* (2006.01)
  *H01L 29/786* (2006.01)
  *H01L 21/308* (2006.01)
  *H01L 51/05* (2006.01)

(52) U.S. Cl.
  CPC .. *H01L 21/28158* (2013.01); *H01L 21/31144* (2013.01); *H01L 29/0692* (2013.01); *H01L 29/1037* (2013.01); *H01L 29/42368* (2013.01); *H01L 29/42384* (2013.01); *H01L 29/66969* (2013.01); *H01L 29/7869* (2013.01); *H01L 29/78645* (2013.01); *H01L 29/78648* (2013.01); *H01L 29/78696* (2013.01); *H01L 21/3083* (2013.01); *H01L 51/0508* (2013.01)

(58) Field of Classification Search
  CPC ........... H01L 29/78648; H01L 29/1037; H01L 29/78645
  See application file for complete search history.

(56) References Cited

U.S. PATENT DOCUMENTS

| | | | |
|---|---|---|---|
| 2005/0270454 A1* | 12/2005 | Ahn | G02F 1/133555 349/114 |
| 2009/0072316 A1* | 3/2009 | Topaloglu | H01L 29/7843 257/365 |
| 2010/0079169 A1* | 4/2010 | Kim | H01L 27/1203 326/120 |

* cited by examiner

TRANSISTOR INCLUDING ACTIVE LAYER HAVING THROUGH HOLES AND MANUFACTURING METHOD THEREOF

CROSS-REFERENCE TO RELATED APPLICATION

This application claims the priority benefit of Taiwan application serial no. 103129352, filed on Aug. 26, 2014. The entirety of the above-mentioned patent application is hereby incorporated by reference herein and made a part of this specification.

BACKGROUND OF THE INVENTION

Field of the Invention

The invention relates to an electronic device and a manufacturing method thereof, and more particularly, relates to a transistor and a manufacturing method thereof.

Description of Related Art

Various semiconductor materials are adapted to be used as sensing elements because the semiconductor materials have favorable sensitivity to environment variation such as gas, liquid or temperature. Also, a smart detector may be made of the semiconductor materials in combination with a microprocessor, so as to provide great value in use for either general household or factory environments.

In order to achieve more preferable sensitivity and enhance speed of sensing reaction, it is one direct and effective choice as to increase a surface area of reaction. To achieve aforesaid purpose, a method in which a porous structure is manufactured on a semiconductor device is generally used. For now, transistors with the porous structure are usually manufactured by a photolithography process. However, the photolithography process has high production costs and is time-consuming, and multiple processes are required before deposition of multi-layer structure can be completed. On the other hand, it is also quite difficult to define the structure after film formation of a metal oxide is completed.

SUMMARY OF THE INVENTION

The invention provides a transistor having an active layer that is porous.

The invention provides a manufacturing method of a transistor, which is capable of manufacturing a transistor having an active layer that is porous by using a simple process with low costs.

A transistor according to an embodiment of the invention includes a substrate, a gate layer, a first insulating layer, an active layer, a source and a drain. The gate layer is disposed on the substrate, and has a plurality of first through holes. The first insulating layer covers the gate layer and a part of the substrate exposed by the first through holes, and forms a plurality of recesses respectively corresponding to the first through holes. The active layer is disposed on the first insulating layer, and has a plurality of second through holes. The second through holes communicate with the recesses, respectively. The source is disposed on a part of the active layer. The drain is disposed on another part of the active layer.

In an embodiment of the invention, the transistor further includes an insulating material layer disposed on the substrate and located between the gate layer and the substrate. The insulating material layer has a plurality of pores communicating with the first through holes, respectively.

In an embodiment of the invention, the transistor further includes a second insulating layer and a gate structure. The second insulating layer is disposed on the active layer, and covers a part of the first insulating layer exposed by the second through holes to form a plurality of third through holes. The gate structure is disposed on the second insulating layer, and extended into the third through holes.

In an embodiment of the invention, a diameter of each of the second through holes is substantially equal to an inner diameter of the corresponding recess.

A manufacturing method of a transistor according to an embodiment of the invention includes the followings. A substrate is provided. An insulating material layer is formed on the substrate. A plurality of blocking balls is placed on a part of a surface of the insulating material layer. A conductive layer is formed on the surface of the insulating material layer. The blocking balls are removed so that the conductive layer becomes a gate layer having a plurality of first through holes. A part of the insulating material layer exposed by the first through holes is removed so that the insulating material layer has recesses communicating with the first through holes, respectively. A first insulating layer is formed and the first insulating layer is caused to cover the gate layer and to be formed in the recesses. An active layer is formed on the gate layer. The active layer has a plurality of second through holes communicating with the first through holes, respectively, and the first insulating layer separates the gate layer and the active layer. A source and a drain are formed on a part and another part of the active layer, respectively.

In an embodiment of the invention, the step of removing the part of the insulating material layer exposed by the first through holes includes: etching the part of the insulating material layer exposed by the first through holes by using the gate layer as an etching mask layer.

In an embodiment of the invention, the step of forming the active layer on the gate layer includes: naturally forming the active layer on the part of the first insulating layer covered on the gate layer, and the active layer naturally forms the second through holes.

In an embodiment of the invention, the manufacturing method of the transistor further includes the followings. A second insulating layer is formed. The second insulating layer is disposed on the active layer, and covers a part of the first insulating layer exposed by the second through holes to form a plurality of third through holes. A gate structure is formed. The gate structure is located on a part of the second insulation layer, and extended into the third through hole to form a gate protrusion portion.

In an embodiment of the invention, a material of the insulating material layer includes an organic dielectric material.

In an embodiment of the invention, a material of the blocking balls includes an organic material.

In an embodiment of the invention, a material of the gate layer, the source and the drain includes a metal material.

In an embodiment of the invention, a material of the first insulating layer includes a metal oxide material.

In an embodiment of the invention, a material of the active layer includes a metal oxide semiconductor material or an organic semiconductor material.

Based on above, in the transistor according to the embodiments of the invention, by using the porous structure formed by the recesses and the second through holes communicating each other, the active layer of the transistor is capable of including a porous structure. Accordingly, the transistor may be developed to be a sensing element including the active layer having greater contact area with the outside in order to increase the sensing sensitivity of the sensing element, or developed to be the fin field effect transistor having a greater channel width between the source and the drain. Furthermore, in the manufacturing method according to the embodiments of the invention, aforesaid porous structure may be manufactured in low costs and simple process to provide a potential commercial value through the process step using the blocking balls and the conductive layer.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
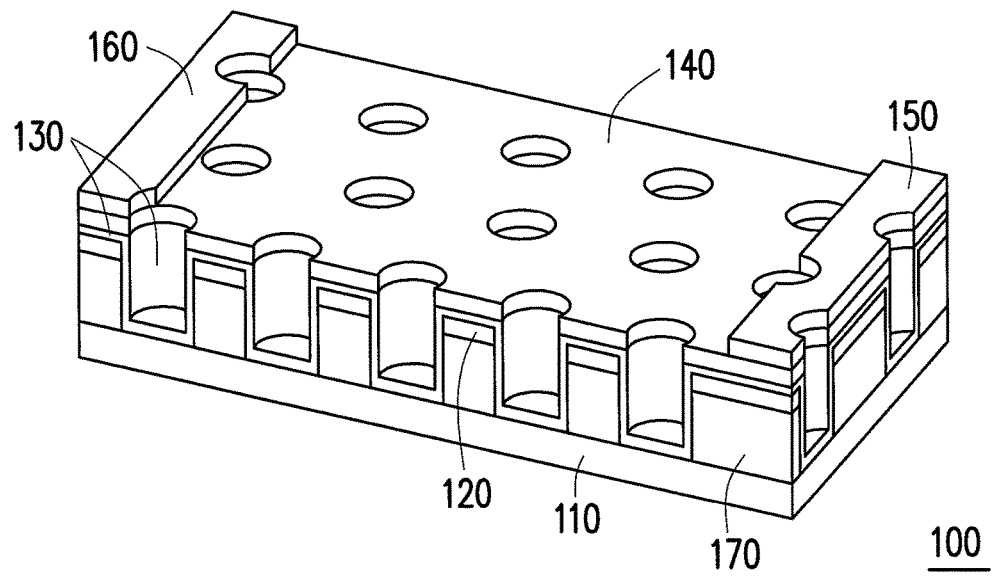
FIG. 1A illustrates a three dimensional view of a transistor according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
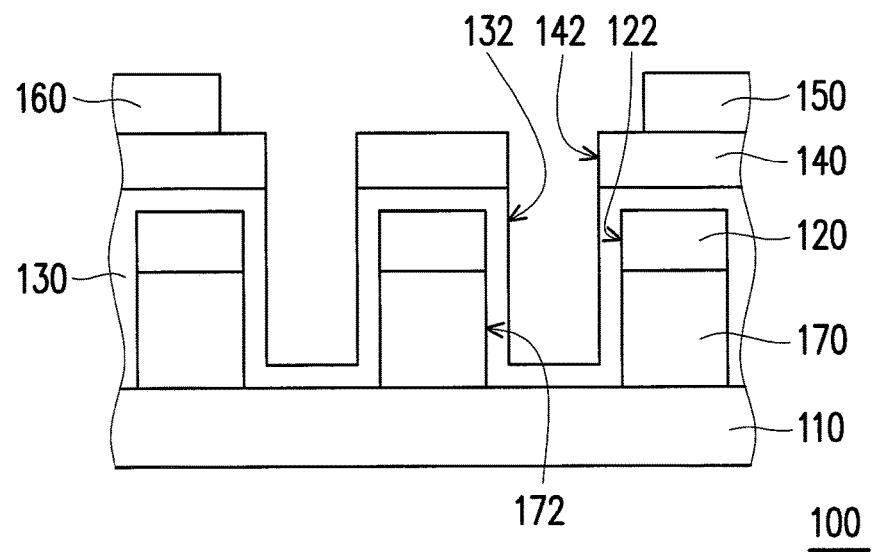
FIG. 1B illustrates a cross-sectional view of the transistor in the embodiment of FIG. 1A.

FIG. 1A illustrates a three dimensional view of a transistor according to an embodiment of the invention. FIG. 1B illustrates a cross-sectional view of the transistor in the embodiment of FIG. 1A. Referring to FIG. 1A and FIG. 1B, a transistor 100 of the present embodiment includes a substrate 110, a gate layer 120, a first insulating layer 130, an active layer 140, a source 150 and a drain 160. The substrate 110 can be an insulating substrate, a conductive substrate or a semiconductor substrate, and a material of the substrate 110 can be a glass, a silicon, a metal or any combination thereof. The gate layer 120 is disposed on the substrate 110, and has a plurality of first through holes 122. In the present embodiment, a material of the gate layer 120 can be a metal material such as aluminum. In the present embodiment, the transistor 100 further includes an insulating material layer 170 disposed on the substrate 110 and located between the gate layer 120 and the substrate 110. The insulating material layer 170 has a plurality of pores 172 communicating with the first through holes 122, respectively. A material of the insulating material layer 170 includes an organic dielectric material, such as polyvinyl pyrrolidone (PVP).

The first insulating layer 130 covers the gate layer 120 and a part of the substrate 110 exposed by the first through holes 122, and forms a plurality of recesses 132 respectively corresponding to the first through holes 122. Because each of the pores 172 communicates with corresponding one of the first through holes 122 of the gate layer 120, the first insulating layer 130 is capable of covering the part of the substrate 110 exposed by the each of the first through holes 122 and the pores 172. A material of the first insulating layer 130 includes a metal oxide material, such as aluminum oxide ($Al_2O_3$).

The active layer 140 is disposed on the first insulating layer 130, and has a plurality of second through holes 142. The second through holes 142 communicate with the recesses 132 respectively, and a diameter of each of the second through holes 142 is substantially equal to an inner diameter of the corresponding recess 132. A material of the active layer 140 includes a metal oxide semiconductor material such as indium gallium zinc oxide (IGZO) or zinc oxide (ZnO), or an organic semiconductor material such as poly(3-hexylthiophene-2,5-diyl) (P3HT).

The transistor 100 further includes the source 150 and the drain 160. The source 150 is disposed on a part of the active layer 140, and the drain 160 is disposed on another part of the active layer 140. In the present embodiment, the source 150 and the drain 160 are separately disposed on the active layer 140. A material of the source 150 and the drain 160 includes a metal material such as aluminum.

In the present embodiment, the pores 172, the first through holes 122, the recesses 132 and the second through holes 142 on the transistor 100 are corresponding and communicating with each other to form the transistor 100 with a porous structure as shown in FIG. 1A and FIG. 1B. Accordingly, this allows the active layer 140 of the transistor 100 of the present embodiment to have a greater contact area with the outside to serve as a sensing element with favorable sensibility (e.g., a sensing element for gas, liquid or temperature). In addition, the structure of the transistor 100 of the present embodiment can also facilitate in subsequent processes for material deposition.

In another embodiment of the invention, the insulating material layer 170 may be omitted if the material of the substrate 110 is an insulating material with the rest in the structure identical to those in the embodiment of FIG. 1A and FIG. 1B, so as to accomplish an effect of structure simplification.

In yet another embodiment of the invention, aforesaid porous structure may also be designed as a structure having strip trenches with a section thereof as illustrated in FIG. 1B, so as to increase the contact area of the active layer 140 with the outside.

Figure 1C:
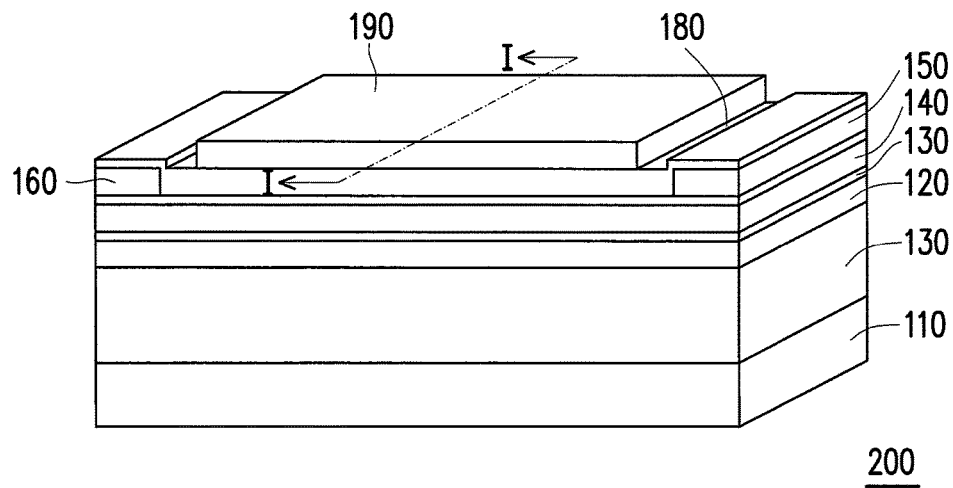
FIG. 1C illustrates a three dimensional view of a transistor according to yet another embodiment of the invention.
Figure 1D:
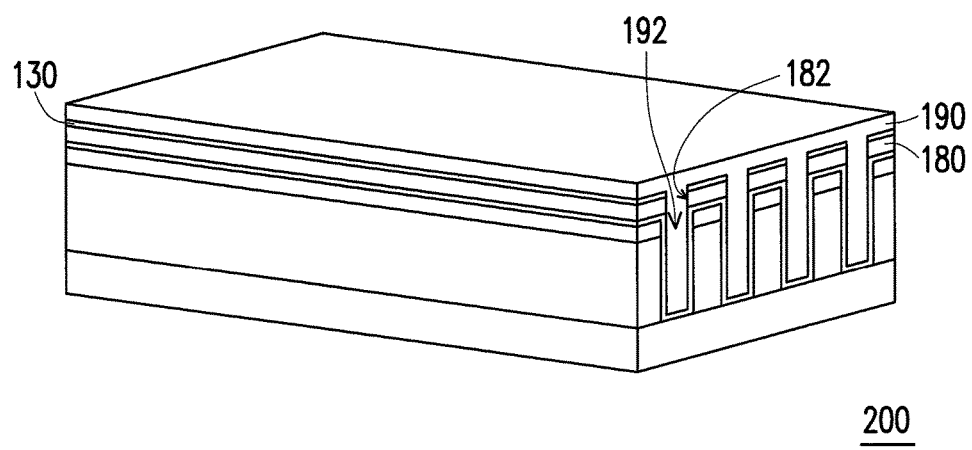
FIG. 1D illustrates a three dimensional view of a section of the transistor of FIG. 1C cut along line I-I.

FIG. 1C illustrates a three dimensional view of a transistor according to yet another embodiment of the invention. FIG. 1D illustrates a three dimensional view of a section of the transistor of FIG. 1C cut along line I-I. Referring to FIG. 1C and FIG. 1D together. A transistor 200 of the present embodiment is an extension application of the embodiment described in FIG. 1A and FIG. 1B. The transistor 200 of the present embodiment is similar to the transistor 100 of FIG. 1A and FIG. 1B, a major difference between the two is that the transistor 200 further includes a second insulating layer 180 and a gate structure 190. In other words, in the present embodiment, the structure of the transistor 100 of the embodiment of FIG. 1A and FIG. 1B is utilized together with the second insulating layer 180 and the gate structure 190 further formed thereon. The second insulating layer 180 is disposed on the active layer 140, and covers a part of the first insulating layer 130 exposed by the second through holes 142 to form through holes 182. The gate structure 190 is disposed on the second insulating layer 180, and extended into the third through holes 182 to form a plurality of gate protrusion portions 192. In the present embodiment, the second insulating layer 180 covers a part of the source 150 and a part of the drain 160. Nevertheless, in other embodiments, it is also possible that the second insulating layer 180 does not cover the source 150 and the drain 160. However, the invention is not limited thereto. A material of the second insulating layer 180 includes a metal oxide material, such as aluminum oxide (Al$_2$O$_3$). A material of the gate structure 190 can be a metal material such as aluminum.

In the foregoing embodiment, a porous structure of the transistor 200 is utilized to dispose the gate structure 190 having the gate protrusion portions 192 on the active layer 140 with the porous structure, such that the transistor 200 of the present embodiment forms a structure of a fin field effect transistor which has a more preferable capability in gate-to-channel control in comparison with structures of traditional transistors, so as to improve an electrical quality of the transistor 200.

Figure 2A:
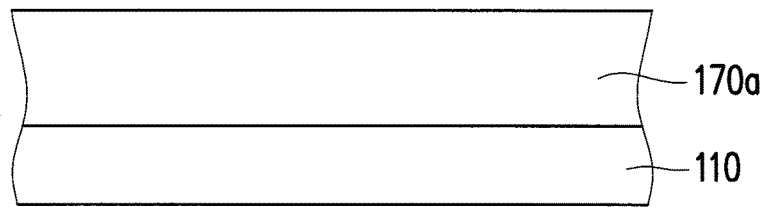
FIG. 2A to FIG. 2G are cross-sectional schematic diagrams illustrating process of a manufacturing method of a transistor according to another embodiment of the invention.
Figure 2B:
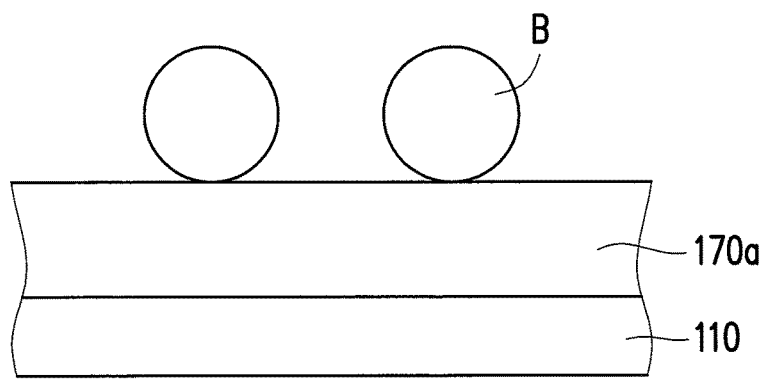

FIG. 2A to FIG. 2G are cross-sectional schematic diagrams illustrating process of a manufacturing method of a transistor according to another embodiment of the invention. Referring to FIG. 2A to FIG. 2G, the manufacturing method of the transistor of the present embodiment can be used to manufacture the transistor 100 of FIG. 1A and FIG. 1B, and includes the following steps. First, as illustrated in FIG. 2A, a substrate 110 is provided. Then, an insulating material layer 170a is formed on the substrate 110. A material of the insulating material layer 170a includes an organic dielectric material, such as polyvinyl pyrrolidone (PVP). Subsequently, as illustrated in FIG. 2B, a plurality of blocking balls B are placed on a surface of a part of the insulating material layer 170a, and configured to prevent the part of the insulating material layer 170a from contacting materials formed in the subsequent processes. A material of the blocking balls B includes an organic material such as polystyrene (PS).

Figure 2C:
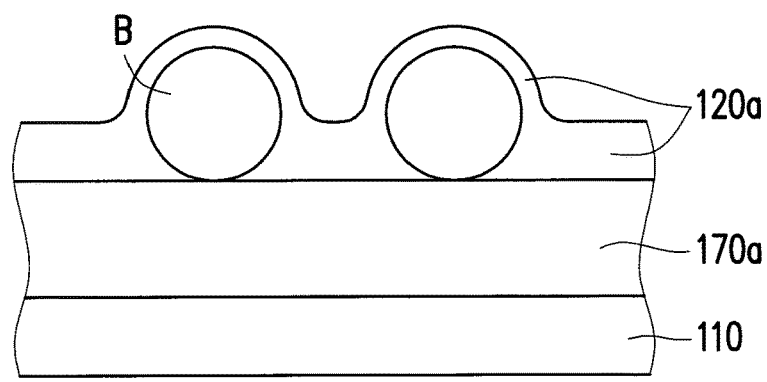
Figure 2D:
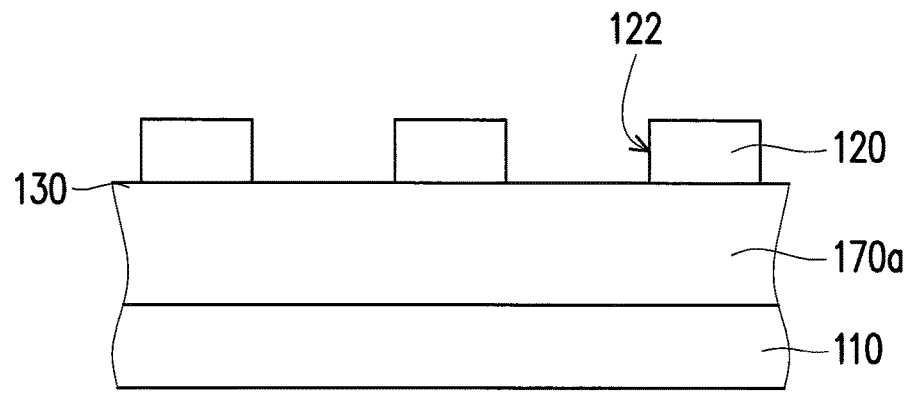

Next, as illustrated in FIG. 2C, a conductive layer 120a is formed on the surface of the insulating material layer 170a. A material of the conductive layer 120a can be a metal material such as aluminum. Thereafter, as illustrated in FIG. 2D, the blocking balls B are removed, so that the conductive layer 120a becomes a gate layer 120 having a plurality of first through holes 122. In this case, a part of the insulating material layer 170a is exposed by the first through holes 122.

Figure 2E:
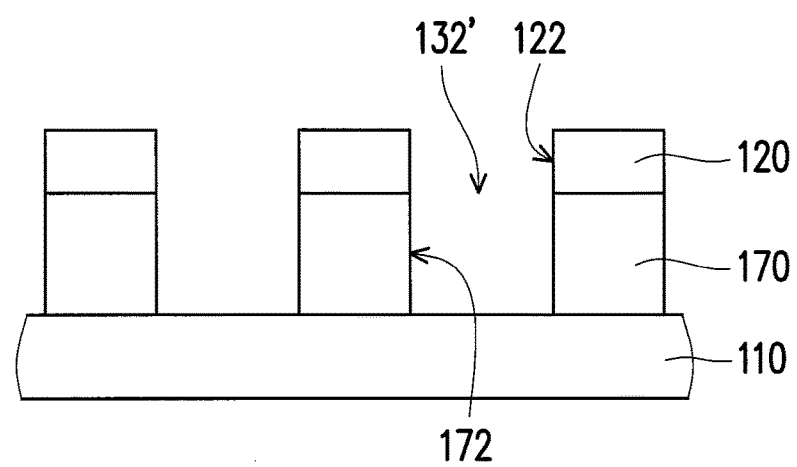

Subsequently, as illustrated in FIG. 2E, the part of the insulating material layer 170a exposed by the first through holes 122 is removed, so that the insulating material layer 170a becomes an insulating material layer 170 having recesses 132' communicating with the first through holes 122, respectively. A method of removing the part of the insulating material layer 170a exposed by the first through holes 122 includes the following. The part of the insulating material layer 170a exposed by the first through holes 122 is etched by using the gate layer 120 as an etching mask layer. As a result, pores 172 are formed, and the pores 172 communicate with the first through holes 122, respectively.

Figure 2F:
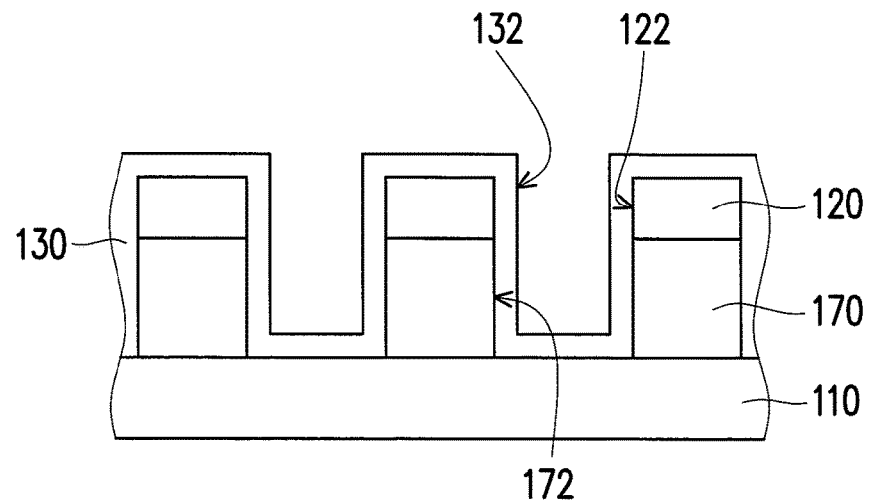
Figure 2G:
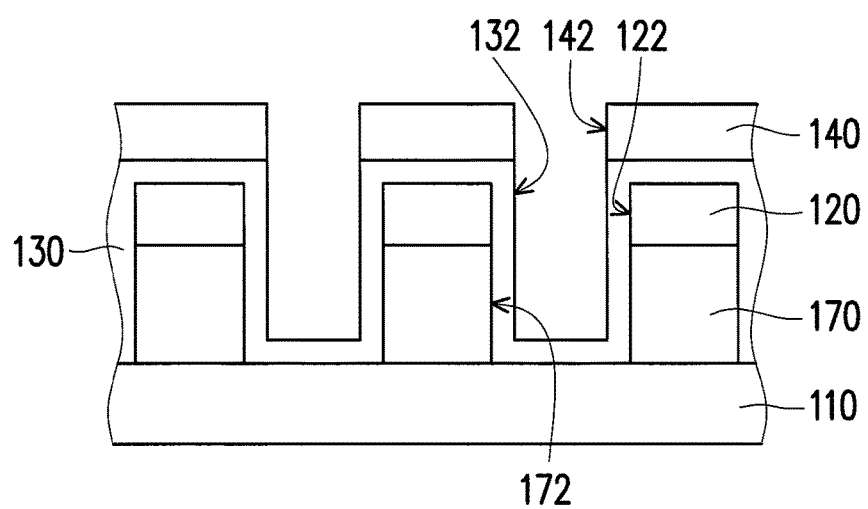

Referring to FIG. 2F which follows after the step of FIG. 2E, a first insulating layer 130 is formed, and the first insulating layer 130 is made to cover the gate layer 120 and to be formed in the recesses 132', so as to form recesses 132. Subsequently, as illustrated in FIG. 2G, an active layer 140 is formed above the gate layer 120. While forming the active layer 140, the active layer 140 is naturally formed on the part of the first insulating layer 130 covered on the gate layer 120. The active layer 140 naturally forms aforesaid second through holes 142, and the second through holes 142 communicate with the first through holes 122, respectively. A method of forming the active layer 140 includes an oblique evaporation or a vertical evaporation. It should be noted that, in the manufacturing method of the transistor of the present embodiment, the recesses 132 of the first insulating layer 130 have a high aspect ratio, i.e. the ratio of the height to the width. Therefore, during the evaporation, the active layer can be selectively formed in relative to the first insulating layer 130 having the recesses 132, such that the active layer 140 can be naturally formed on the part of the first insulating layer 130 covered on the gate layer 120.

Then, as illustrated in FIG. 1B, a source 150 and a drain 160 are formed on a part and another part of the active layer 140, respectively, so as to form the transistor 100. The source 150 and the drain 160 may be formed in the same step, or formed in different steps, respectively.

In the manufacturing method of the transistor according to the present embodiment, the blocking balls B are utilized to manufacture the first through holes 122 of the conductive layer 120a, and then the gate layer 120 formed by the conductive layer 120a is utilized to serve as the etching mask layer, so that the transistor with the porous structure can be manufactured accordingly. In the present embodiment, the recesses 132 of the first insulating layer 130 with the surface of the porous structure have a large aspect ratio. This method is advantageous in low costs and simply manufacturing process without repeatedly performing the step for the photolithography process, and adapted to developments for the sensing element (e.g., the sensing element for gas, liquid or temperature) with favorable sensibility and reasonable price.

In yet another embodiment of the invention, a manufacturing method of a transistor may be used to manufacture the transistor 200 of FIG. 1C and FIG. 1D. This method can be used to further manufacture the transistor 100 manufactured based on the manufacturing method illustrated in FIG. 2A to FIG. 2G. Hereinafter, the manufacturing method described in the embodiment of FIG. 2A to FIG. 2G is not repeated hereinafter.

In the present embodiment, a fin field effect transistor (i.e., the transistor 200 of FIGS. 1C and 1D) can be further manufactured by utilizing the transistor 100 of FIG. 1A and FIG. 1B, and the manufacturing method includes the following steps. A second insulating layer 180 is formed on the manufactured transistor 100, and covers the active layer 140 and the drain 150 and the drain 160. The second insulating layer 180 also covers a part of the first insulating layer 130 exposed by the second through holes 142 to form a third through holes 182. A material of the second insulating layer 180 includes a metal oxide material, such as aluminum oxide (Al$_2$O$_3$). It should be noted that, in another embodiment, the second insulating layer can cover the active layer 140 without covering the source 150 and the drain 160. However, the invention is not limited thereto.

Subsequently, the gate structure 190 is formed on the second insulating layer 180, and extended into the third through holes 182 to form a plurality of gate protrusion portions 192. A material of the gate structure 190 can be a metal material such as aluminum.

In the foregoing embodiment, the transistor 200 manufactured by utilizing the structure of FIG. 1A and FIG. 1B has a structure of the fin field effect transistor. This process method may be used to manufacture the transistor 200, which has a more preferable capability in gate-to-channel control in comparison with structures of traditional transistors, by using a simpler process, so as to improve the electrical quality of the transistor 200.

In summary, the transistor according to the embodiment of the present embodiment includes the porous structure having large aspect ratio, such that the active layer also includes the porous structure. Accordingly, the transistor may be developed to be a transistor including the active layer having greater contact area with the outside in order to increase the sensing sensitivity of the sensing element, or developed to be the fin field effect transistor having a greater channel width between the source and the drain.

In terms of applications for the transistor structure, the fin field effect transistor according to the embodiments of the invention and the manufacturing method thereof includes a simpler manufacturing process and more preferable capability in gate-to-channel control in comparison with structures of traditional transistor, such that the electrical quality of the transistor can be improved.

Furthermore, when the transistor with the porous structure having large aspect ratio is manufactured by using the manufacturing method of the transistor structure according to embodiment of the invention, it is advantageous in low costs and simple process through the process step using the blocking balls and the conductive layer because it is not required to repeatedly perform the step for photolithography process, and is adapted to developments for the sensing element with favorable sensibility and potential commercial value.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A transistor, comprising:
    a substrate;
    a gate layer, disposed on the substrate, and having a plurality of first through holes;
    a first insulating layer, covering the gate layer and a part of the substrate exposed by the first through holes, and forming a plurality of recesses respectively corresponding to the first through holes;
    an active layer, disposed on the first insulating layer, and having a plurality of second through holes, wherein the second through holes communicate with the recesses, respectively;
    a source, disposed on a part of the active layer;
    a drain, disposed on another part of the active layer;
    a second insulating layer, disposed on the active layer, and covering a part of the first insulating layer exposed by the second through holes to form a plurality of third through holes; and
    a gate structure, disposed on the second insulating layer, and extended into and completely filling up the third through holes,
    wherein the first insulating layer has a plurality of first side surfaces, the first side surfaces respectively surround and define a size of the recesses, the active layer has a plurality of second side surfaces, and the second side surfaces respectively surround and define a size of the second through holes, and the size of each of the recesses is equal to the size of the corresponding second through hole.

2. The transistor of claim 1, further comprising an insulating material layer, disposed on the substrate, and located between the gate layer and the substrate, wherein the insulating material layer has a plurality of pores communicating with the first through holes, respectively.

3. The transistor of claim 2, wherein a material of the insulating material layer comprises an organic dielectric material.

4. The transistor of claim 1, wherein a material of the gate layer, the source and the drain comprises a metal material.

5. The transistor of claim 1, wherein a material of the first insulating layer comprises a metal oxide material.

6. The transistor of claim 1, wherein a material of the active layer comprises a metal oxide semiconductor material or an organic semiconductor material.

7. The transistor of claim 1, wherein a diameter of each of the second through holes is substantially equal to an inner diameter of the corresponding recess.

* * * * *